United States Patent [19]
Steinman et al.

[11] Patent Number: 5,652,871
[45] Date of Patent: Jul. 29, 1997

[54] PARALLEL PROXIMITY DETECTION FOR COMPUTER SIMULATION

[75] Inventors: Jeffrey S. Steinman, Chatsworth, Calif.; Frederick P. Wieland, Spotsylvania, Va.

[73] Assignee: The United States of America as represented by the Administrator of the National Aeronautics and Space Administration, Washington, D.C.

[21] Appl. No.: 425,751

[22] Filed: Apr. 10, 1995

[51] Int. Cl.$^6$ ............................. G06F 17/00; G06F 19/00
[52] U.S. Cl. ........................... 395/500; 364/578; 364/400
[58] Field of Search ........................... 395/500; 364/578, 364/423, 232.3, 916.5, 922.5, 933.8

[56] References Cited

PUBLICATIONS

Hirata et al., "An Implementation of a Technique for Sharing Variables in Time Warp," 1995 Simulation Symposium, pp. 13–21.
Raghunandan et al., "Dynamically Switching Between Lazy and Aggressive Cancellation in a Time Warp Parallel Simulator," 1995 Simulation Symposium, pp. 22–30.
Reiher et al., "Providing Determinism in the Time Warp Operating System—Costs, Benefits, and Implifications," 1990 Experimental Distributed Systems Workshop, pp. 113–118.
Steinman, "Interactive SPEEDES," 1991 Simulation Symposium, pp. 149–158.
Steinman et al., "Global Virtual Time and Distributed Synchronization," 1995 Parallel and Distributed Simulation Workshop, pp. 139–148.
Wieland et al., "Parallel–Discrete–Event Simulation (PDES): A Case Study in Design, Development, and Performance Using SPEEDES," 1995 Parallel and Distributed Simulation Workshop, pp. 103–110.
Bagrodia, R. and Liao, W. "Parallel Simulation of the Sharks World Problem." In Proceedings of the Winter Simulation Conference. Dec. 1990. pp. 191–198.
Chandy, K. and Misra, J. "Distributed Simulation: A Case Study in Design and Verification of Distributed Programs", IEEE Transactions on Software Engineering, vol. SE–5, No. 5, pp. 440–452, 1979.
Felderman, R. and Kleinrock, L. "Two Processors Time Warp Analysis: Some Results on a Unifying Approach", Proceedings of the SCS Multiconference on Advances in Parallel and Distributed Simulation, vol. 23, No. 1, pp. 3–20.
Fujimoto, R. "Design and Evaluation of the Rollback Chip: Special Purposes Hardware For Time Warp", IEEE Transactions of Computers. vol. 41, No. 1, pp. 68–82, 1992.
Fujimoto, R. "Lookahead in Parallel Discrete–Event Simulation", International Conference on Parallel Processing, vol. 3, pp. 34–41, 1988.
Fujimoto, R. "Parallel Discrete Event Simulation", Communications of the ACM, vol. 33, No. 10, pp. 30–53, 1990.

(List continued on next page.)

*Primary Examiner*—Kevin J. Teska
*Assistant Examiner*—Leigh Marie Garbowski
*Attorney, Agent, or Firm*—John H. Kusmiss; Thomas H. Jones

[57] ABSTRACT

The present invention discloses a system for performing proximity detection in computer simulations on parallel processing architectures utilizing a distribution list which includes movers and sensor coverages which check in and out of grids. Each mover maintains a list of sensors that detect the mover's motion as the mover and sensor coverages check in and out of the grids. Fuzzy grids are included by fuzzy resolution parameters to allow movers and sensor coverages to check in and out of grids without computing exact grid crossings. The movers check in and out of grids while moving sensors periodically inform the grids of their coverage. In addition, a lookahead function is also included for providing a generalized capability without making any limiting assumptions about the particular application to which it is applied. The lookahead function is initiated so that risk-free synchronization strategies never roll back grid events. The lookahead function adds fixed delays as events are scheduled for objects on other nodes.

41 Claims, 6 Drawing Sheets

OTHER PUBLICATIONS

Gordon, L. "On Distributed Simulation Involving Human Interaction", Proceedings of the SCS Summer Computer Simulation Conference, pp. 1–4, 1992.

Hontalas, P., et al. "Performance of the Colliding Pucks Simulation of the Time Warp Operating System", In Proceedings of the SCS Multiconference on Distributed Simulation, vol. 21, No. 2, Mar. 1989, pp. 3–7.

Jefferson, D. "Virtual Time", ACM Transaction on Programming Languages and Systems, vol. 7, No. 3, pp. 404–425, 1985.

Jefferson, David et al. "Distributed Simulation and the Time Warp Operating System", ACM Operating System Review. Nov. 1987.

Lubachevsky, B. "Several Unsolved Problems in Large–Scale Discrete Event Simulations", In Proceedings of the 7th Workshop on Parallel and Distributed Simulation (PADS93), vol. 23, pp. 60–67, 1993.

Rapaport, D. "The Event Scheduling Problem in Molecular Dynamic Simulation." Journal of Computational Physics. vol. 34, 1980. pp. 184–201.

Rieher, P.L. et al. "Cancellation Strategies in Optimistic Execution Systems," Proceedings of the SCS Muylticonference on Distributed Simulator, vol. 22, No. 1, pp. 112–121. 1990.

Steinman, J. "SPEEDES: A Unified Approach to Parallel Simulation", Proceedings of the SCS Multiconference on Advances in Parallel and Distributed Simulation, vol. 24, No. 1, 1992.

Steinman, J. "Breathing Time Warp", Proceedings of the Federated Computing Research Conference 7th Workshop on Parallel and Distributed Simulation (PADS93), 1993.

Steinman, J. "SPEEDES: A Multiple–Synchronization Environment for Parallel Discrete Event Simulation", International Journal in Computer Simulation, vol. 2, pp. 251–286, 1992.

Steinman, J. "Incremental State Saving In SPEEDES Using C++", Proceedings of the SCS Winter Simulation Conference, 1993.

Wieland, F. et al. 1989. "The Performance of a Distributed Combat Simulation with the Time Warp Operating System." Concurrency: Practice and Experience vol. 1 pp. 35–50.

Wieland, F. "A Critical Path Tool for Parallel Simulation Performance Optimization." Proceedings of the International Conference on System Sciences, 1991.

Wieland, F., Reiher, P. and Jefferson, D. "Experiences in Parallel Performance Measurement: The Speedup Bias." In Proceedings of the Third Symposium on Experience with Distributed Multiprocessor Systems. Mar. 1992.

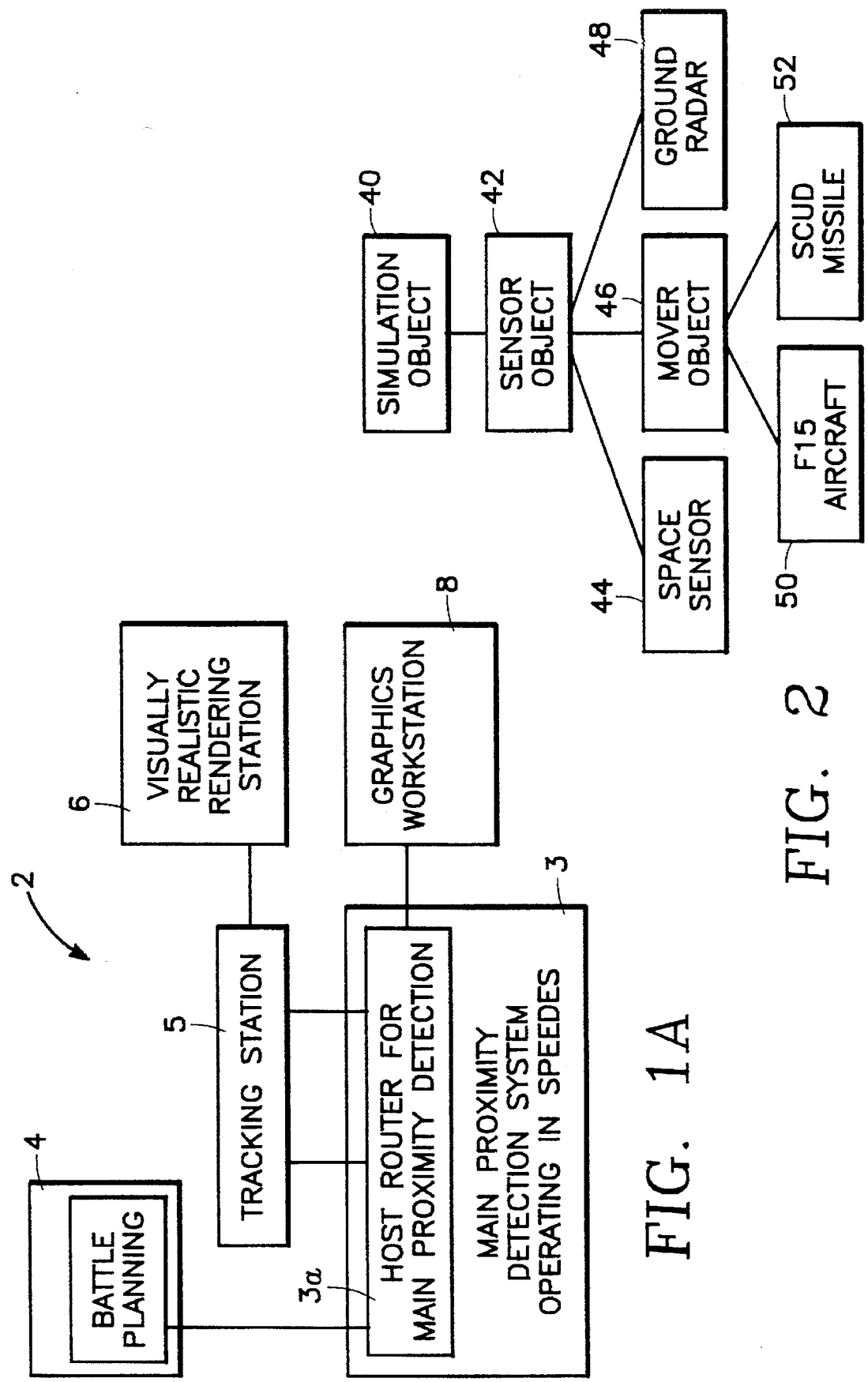

PARALLEL PROXIMITY DETECTION FOR COMPUTER SIMULATION

ORIGIN OF INVENTION

The invention described herein was made in the performance of work under a NASA contract, and is subject to the provisions of Public Law 96-517 (35 USC 202) in which the contractor has elected not to retain title.

BACKGROUND OF THE INVENTION

1. Field of the Invention

The present invention relates, in general, to performing proximity detection for computer simulations on parallel processing architectures, and in particular, for detecting the proximity of moving objects in a logically correct parallel discrete-event simulation.

2. Related Art

Providing proximity detection for simulations involving moving objects can be critical, especially when object interactions are restricted to finite ranges. Various parallel simulation studies in the past, such as "toy" simulations, have touched on the subject of proximity detection. These "toy" simulations ranged from colliding pucks to swimming sharks devouring nearby fish. However, "toy" simulations are not the only applications that require proximity detection. For example, interactive simulations, virtual reality, colliding space debris, biological models, and the modeling of interacting particles with short range forces are all real-world applications that require proximity detection.

In addition, proximity detection is also applied in the military community to confederate simulation elements by using the Distributed Interactive Simulation (DIS) set of protocols. Nevertheless, the DIS approach is not a logically correct simulation strategy because it uses the wall clock for synchronization. Events in a DIS exercise are therefore not repeatable. Protocol Data Unit (PDU) messages are broadcast and received by different DIS "cells" without regard for rigorous time ordering. Because DIS protocols were designed for real time training and systems acquisition decisions, the rigorous synchronization required for analytic studies is not as critical.

DIS uses a "dead reckoning" technique for simulation objects to compute the locations of other objects in their virtual world. DIS objects periodically broadcast their state information, which includes parameters for their dead-reckoning equations, to all of the other objects in the simulation. As a result, if there are N objects in the simulation, a total of N messages would be required, ie., one from each object. Each object must process and store the N messages resulting in a loss of scalability.

Objects broadcast their state information when either five real-time seconds have elapsed since the last broadcast or when the object has determined that the dead reckoning system, computed by the other DIS cells, is in error. Errors in the dead reckoning system arise when an object changes its equations of motion (EOM), or if cumulative errors in the dead reckoning system have exceeded a certain threshold.

Both conditions are motivated by the use of an unreliable "User Datagram Protocol" (UDP) for message communication and for providing interoperability. Consequently, DIS objects broadcast their state more frequently than what would have been required by strict adherence to discrete-event simulation practices. However, DIS is not technically a true synchronized discrete-event protocol.

Thus, the DIS strategy assumes that the perception envelope of each sensor includes the entire virtual world. Each sensor receives information about all moving objects continually during the simulation. The algorithms within the computer image generators that are connected to each sensor determine which objects in the virtual world are to be rendered or ignored.

A second example illustrating methods for proximity detection is the Concurrent Theater Level Simulation (CTLS) implemented under the Time warp Operating System (TWOS). In the initial approach of this system, the battlefield was decomposed into grids that represented physical regions of space. Although the scalar speed of the objects and their direction of motion could be changed at any time, objects were constrained to move in straight lines. Also, because all motion was modeled as a sequence of straight-line segments, only one type of EOM was needed. Thus, curved trajectories, for example, could be approximated only through a set of straight lines.

Combining the straight-line motion with a rectangular battle space grid boundary crossings is easily computed. If a mover changed its motion by either changing its speed or direction, grid crossing events that were erroneously scheduled were canceled through user cancellation messages. The actual proximity detection computations were performed by the grid objects themselves, which reduced overall message traffic. As a result, consistency in the treatment of proximity detection is ensured and the work from the moving objects is reduced.

However, it was not anticipated that military simulations would tend to behave like football games, where the player with the ball is chased. In a typical CTLS simulation run, most of the ground units would inevitably congest into a small number of grids to fight their battle. Because grids performed most of the work, they became bottlenecks, thus limiting the amount of parallelism in the simulation.

Consequently, proximity detection for simulations involving moving objects can be critical, especially when object interactions are restricted to a finite range. Hence, the goal of proximity detection is to provide correct spatial information for moving objects and participating sensor objects.

However, one of the fundamental and most difficult problems in supporting parallel simulations for military applications is providing proximity detection that does not bog down the simulation. The typical system currently utilized is dependent solely on the wall clock for synchronization, but this system is not logically synchronized and limits the repeatability of the simulation on parallel processing computers. Also, proximity detection must provide each participating sensing object with a list of equations of motion (EOM) for all other objects within its sensor range. This list must be correct at all simulation times.

Therefore, what is needed is a system that reduces or eliminates bottlenecks in the proximity detection simulation. What is also needed is a system that virtually eliminates instabilities by further reducing the number of messages required. What is also needed is a system that allows unrelated grid events to be processed out of order.

What is additionally needed is a system that can provide correct spatial information for moving objects. What is additionally needed is generalized proximity detection for moving objects in a logically correct parallel discrete-event simulation. What is further needed is a system for determining the views of each object in a manner that is fully scalable in terms of CPU usage, number of messages, and memory requirements.

Whatever the merits of the above mentioned existing systems and methods, they do not achieve the benefits of the present invention.

SUMMARY OF THE INVENTION

To overcome the limitations in the prior art described above, and to overcome other limitations that will become apparent upon reading and understanding the present specification, the present invention discloses a system for performing proximity detection in computer simulations on parallel processing architectures.

The present invention utilizes a distribution list system which includes movers and sensor coverages that check in and out of grids while moving sensors periodically inform the grids of their coverage. Fixed sensors only need to inform the grids once during initialization. Also, the grids manage a list of movers and a list of sensors that are operating in their represented space.

When a mover checks into a new grid it simultaneously checks out of its old grid, except during initialization when it checks into its first grid. Also, the movers always maintain a distribution list of sensors that require its EOM. The new grid returns its current list of sensors back to the mover so that the mover can update its distribution list.

Similarly, when a sensor updates its coverage, it sends messages to new grids that are now in its coverage, and also sends messages to old grids that are no longer in its coverage. The grids then relay this sensor information to the movers in their mover list so that movers can also update their distribution of sensors.

Specifically, each mover maintains a list of sensors that detect the mover's motion as the mover and sensor coverages check in and out of the grids. This list can be viewed as a mover's distribution list by sensors that require its equations of motion (EOMs). As a result, every sensor in the simulation receives a list of pointers to the EOMs for all movers that are within its sensing range. This list is valid at any time in the simulation so that sensors can scan the mover's proximity at any time without requiring extra messages to be sent. Thus, proximity detection in the present invention operates in the background by providing mover equations of motion to sensors. The majority of simulation computations are performed through sensor scan events that require no extra messages.

In addition, since grid crossings can be of an irregular shape, fuzzy grids are used so that their calculations do not need to be exact. Fuzzy grids model simulated space and manage spatial information for moving objects and sensor coverages. Fuzzy grids allow movers and sensor coverages to check in and out of grids without computing exact grid crossings. Instead, sensor coverages are expanded by fuzzy resolution parameters to accommodate the fuzzy grid crossings. The fuzzy resolution parameters are defined to reflect various grid uncertainties.

A lookahead function is also included for providing a generalized capability without making any limiting assumptions about the particular application to which it is applied. The lookahead function is the time difference, or delay, between a processed event and the events that it generated. Optimistic parallel simulations with a high degree of lookahead tend to have fewer rollbacks. Conversely, conservative simulations often rely on lookahead functions to ensure causality or to prevent deadlocks.

The lookahead function of the present invention is initiated so that risk-free synchronization strategies never roll back grid events. The lookahead function adds fixed delays as events are scheduled for objects on other nodes. Zero time delays are allowed for events scheduled between objects on the same node. Consequently, sensors receive their updates, in T units of simulation time, after the mover determines that it is in a new grid.

Additionally, the lookahead function is scalable in terms of CPU usage, number of messages, and memory requirements. Thus, the present invention can operate independently of a clock, making the results repeatable and useful for analytic studies, as well as real-time interactive simulations.

Therefore, a feature of the present invention is to provide correct spatial information for moving objects. Another feature of the present invention is to provide generalized proximity detection for moving objects in a logically correct parallel discrete-event simulation. Yet another feature of the present invention is to provide a system for determining the views of each object in a manner that is fully scalable in terms of CPU usage, number of messages, and memory requirements.

An advantage of the present invention is the reduction and elimination of bottlenecks in proximity detection simulations. Another advantage of the present invention is to virtually eliminate instabilities by further reducing the number of messages required. Yet another advantage of the present invention is that unrelated grid events can be processed out of order.

BRIEF DESCRIPTION OF THE DRAWINGS

Referring now to the drawings in which like reference numbers represent corresponding parts throughout:

FIG. 1A illustrates the overall parallel processing proximity detection system of the present invention;

FIG. 2 illustrates a sample inheritance tree for various moving objects and sensors in accordance with the present invention;

DETAILED DESCRIPTION OF THE PREFERRED EMBODIMENT

Figure 1B:
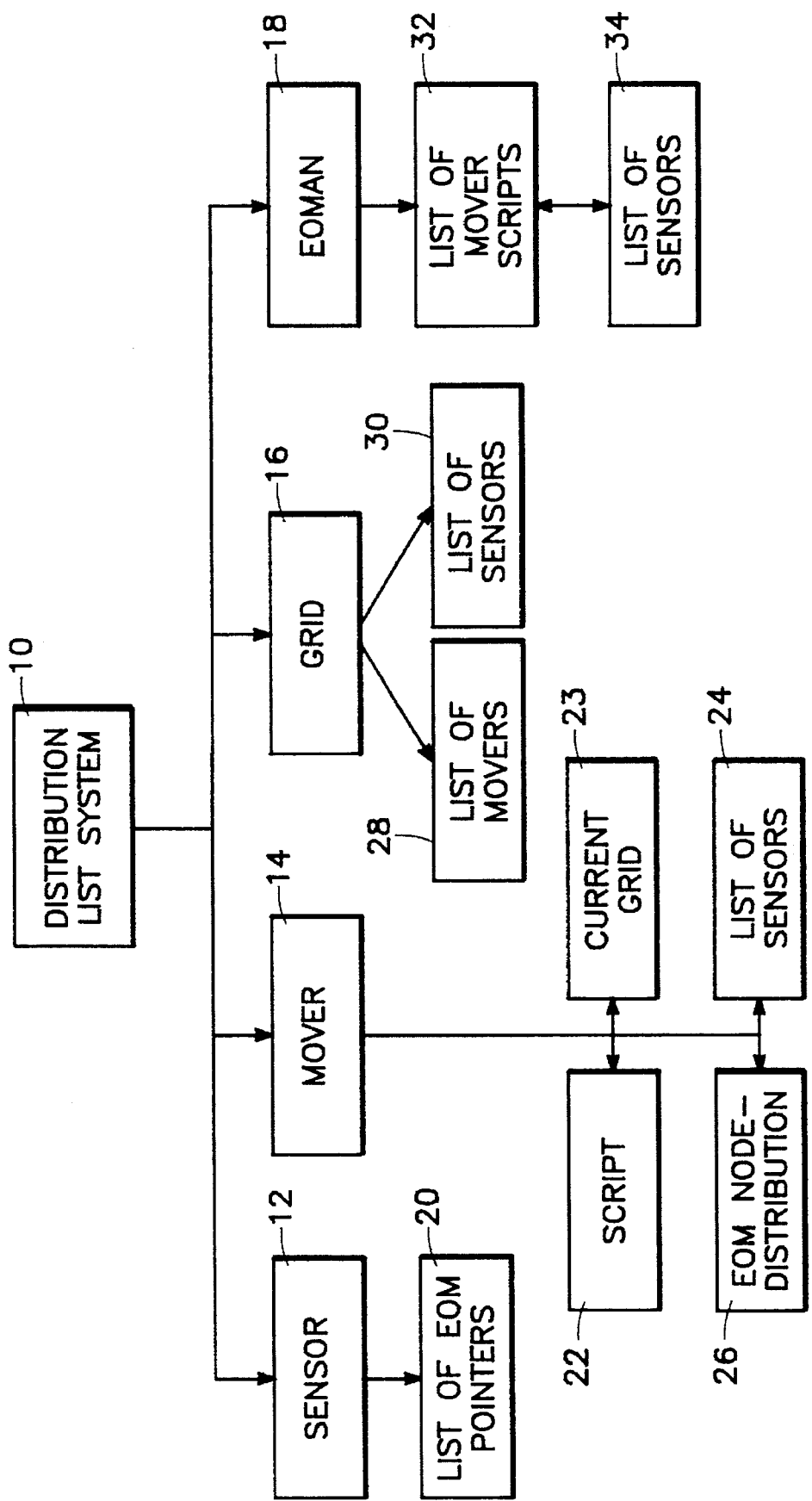
FIG. 1B illustrates the simulation objects of the present invention.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

FIG. 1A illustrates the overall parallel processing proximity detection system 2 of the present invention. The main proximity detection station 3 utilizing a host router 3a for proximity detection with a distribution list of the present invention is connected in parallel to a first processor 4, which can be a battle planning station, to a tracking station 5, which itself is wired to a visually realistic rendering system 6, and to a graphics workstation 8. An operating system, such as one called SPEEDES disclosed in U.S. patent application Ser. No. 08/363,546 filed Dec. 12, 1994 by Jeffrey S. Steinman entitled SYNCHRONOUS PARALLEL SYSTEM FOR EMULATION AND DISCRETE EVENT SIMULATION, the disclosure of which is incorporated herein by reference, is operating on the main proximity detection station 3. The distribution system of the present invention runs in the SPEEDES environment.

FIG. 1B illustrates the simulation objects of the present invention. The distribution list system 10 is used to detect the proximity of moving objects in computer simulations. Correct spatial information is attained by the present invention for moving objects, or movers, and participating sensor objects, or sensors.

There are four types of simulation objects required by the distribution list system 10 of the present invention for proximity detection. The four types of simulation objects include a sensor 12, a mover 14, a grid 16, and a simulation object (EOMAN 18) containing a list of mover scripts 32 and a list of sensors 34 for each mover script. Each simulation object includes important data structures. For instance, the sensor 12 contains a list of pointers 20 to mover equations of motion (EOMs). The mover 14 contains a script 22 or sequence of EOMs describing its motion, a current grid 23, a list of sensors 24 (i.e., its distribution list), and EOM node-distribution information 26. The grid 16 contains a list of movers 28 that are "in" their space and a list of sensors 30 that can "see" their space.

FIG. 2 illustrates a sample inheritance tree for various moving objects and sensors in accordance with the present invention. A sensor 42 object inherits from a simulation object 40. A moving sensor (which is not a mover and is not detectable), such as a space sensor 44, a mover object 40, and a fixed non-moving sensor, such as a ground radar 48, inherit from the sensor object 42. A mover and a sensor, such as an F15 Aircraft 50, and a mover with sensing disabled, such as a SCUD Missile 52, inherits from the mover object 46.

The main requirement of the present invention includes proximity detection to provide each participating sensing object with a list of equations of motion for all other objects within its sensor range. This list must be correct at all simulation times.

In addition to the main requirement, there are requirements concerning scalability. The computations, messages, and memory should all scale as the physical problem scales. Precisely, the proximity detection system must scale at least as well or better than, within a constant, the sensor scan computations. If every object sees every other object, then the proximity detection system must scale no worse than $N^2$. If every object sees only one other object on the average, then the system must scale as N. These considerations reflect the work loads of sensors, which should dominate the overall central processing unit (CPU) usage in the simulation.

Next, there are numerous correctness requirements which must be met. First, the system must be logically correct. In other words, it must provide correct results independent of wall clock time, CPU capability, and communications latency. The system must also provide repeatable results. Next, the solution must support asynchronous sensors with different scan modes and rates. This requirement eliminates those solutions relying on global time steps that synchronize all movers and sensors.

Also, the system must be independent of the EOMs used by the movers. This requirement can be fulfilled, for example, by using a virtual base class object in which the EOM interface is defined without providing details of the implementation. Finally, the system must allow objects to change their motion at any time. These changes must be propagated to all other sensors that have the object in their field of view.

Figures 3, 4:
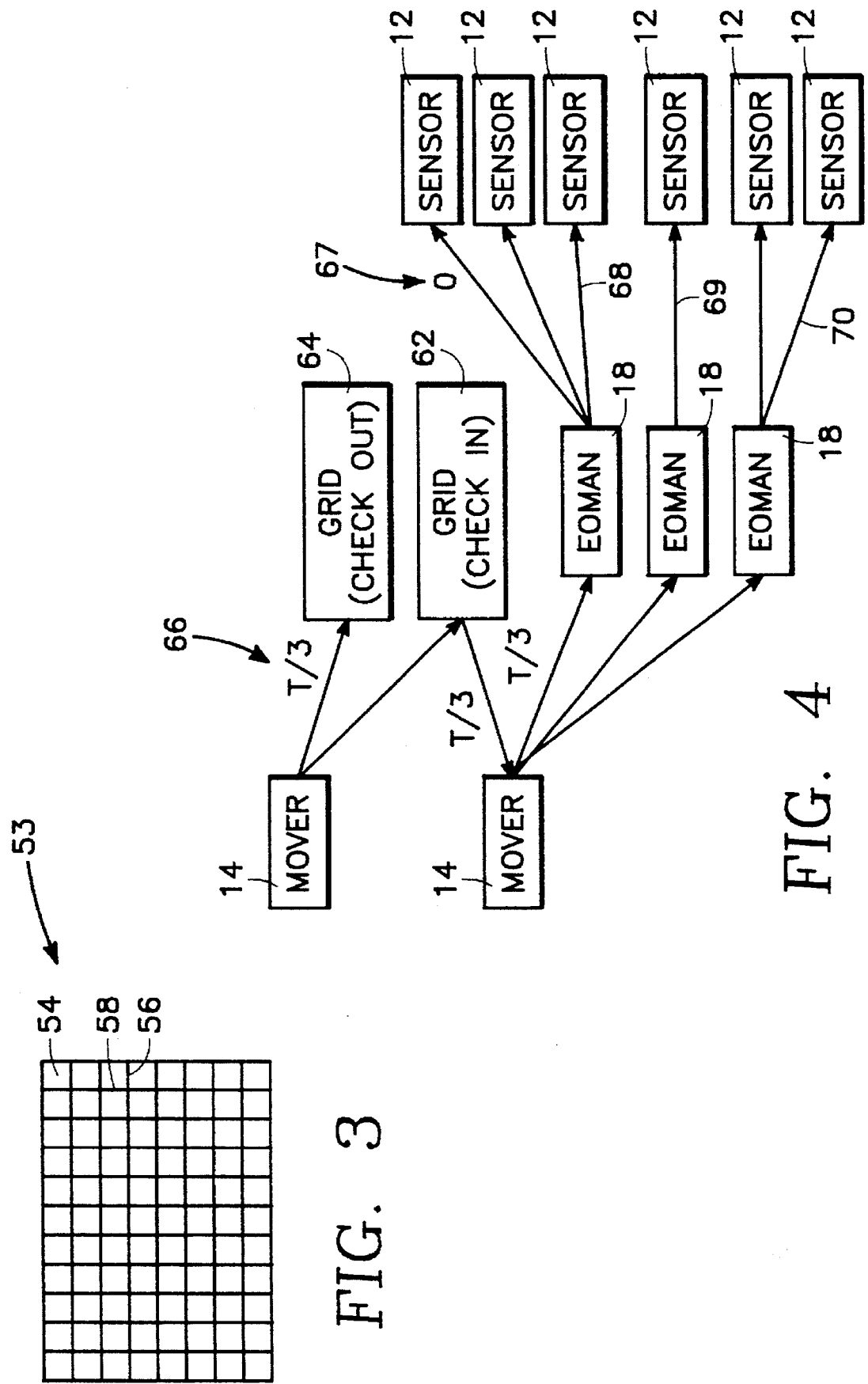
FIG. 3 illustrates a tiled grid for a simulated arena.
FIG. 4 illustrates a sample distribution list strategy for a sequence of events for a mover checking in and out of grids.

FIG. 3 illustrates a tiled grid 53 for a simulated arena. The grids may be rectangular 54 or they may be irregular in their shape. For example, when the earth is marked with longitude 58 and latitude 56 markers, the earth is typically decomposed into approximately equal area grids, with the grids being first decomposed into equal latitude bands 56. Next, each latitude band 56 is further decomposed into longitude segments 58 to provide nearly equal area grids covering the earth.

This approach easily computes a unique grid identification, given a mover's latitude and longitude, using modular arithmetic. Likewise, card dealing the grids to computer nodes provides a simple way, utilizing modular arithmetic, to determine the processor node for each grid.

FIG. 4 illustrates a sample distribution list strategy for a sequence of events for a mover checking in and out of grids. Referring back to FIG. 1B along with FIG. 4, the distribution list system uses grids 16 to model simulated space. Sensors 12 may be fixed or moving and additionally, can be enabled or disabled.

The goal of the distribution list system 10 is to provide each sensor 12 with the equation of motion for all nearby movers 14. Also, movers 14 move according to a sequence of one or more consecutive equations of motion. The mover's list of equations of motion is the script 22. Gaps are not allowed in the mover's script 22. If a mover 14 stops for a period of time, it must have an equation of motion that describes its position. When a mover's script 22 is over, the mover 14 should not be seen by any of the sensors 12.

Movers 14 are also defined as sensors 12 (i.e., mover objects inherit from sensor objects) but their sensing capabilities may be disabled if desired. For example, in a simulation focusing on the interaction of military aircraft, background commercial air traffic may be modeled as movers without sensors. Support for multiple inheritance is not assumed or required.

Movers 14 check in and out of grids 16 while moving sensors 12 periodically inform the grids 16 of their coverage. Fixed sensors only need to inform the grids 16 once during initialization. Grids 16 manage a list of movers 14 and a list of sensors that are operating in their represented space. Grids 16 do not interact with other grids 16, nor do they propagate self propelled events.

When a mover 14 checks into a new grid 64, it simultaneously checks out of its old grid 64, except during initialization when it checks into its first grid. The new grid 62 returns its current list of sensors back to the mover 14 so that the mover can update its distribution list. Movers 14 always maintain a distribution list of sensors 12 that require its equations of motion.

Similarly, when a sensor 12 updates its coverage, it sends messages to new grids 62 that are now in its coverage and to old grids 64 that are no longer in its coverage. The grids 16 then relay this sensor information to the movers 14 in their mover 14 list so that movers 14 can also update their distribution list of sensors.

Each mover 14 keeps track of which nodes already have its script. All nodes that require the mover's script receive the script through a message sent to one of its EOMAN objects 18. A hashing scheme based on the mover's unique identification determines which EOMAN 18 to use so that a single EOMAN 18 on a node does not become a bottleneck. Next, messages time tagged slightly later than the script's arrival time, which must arrive first, are sent to EOMAN objects 18. They are sent to identify which new sensors 12 need the mover's 14 current equation of motion and also to identify which old sensors 12 no longer contain the mover 14 in their coverage.

EOMAN objects 18 then forward these changes to their local sensors 12 by sending a message to new sensors 12, containing a pointer to the mover's 14 current equation of motion, or by informing old sensors 12 that they can no longer see the mover 14. From these messages, sensors 12 maintain a list of pointers to their mover's 14 current equation of motion, which is the primary goal of the distribution list system.

A particular sensor's 12 lists of equations of motion is actually a superset of the actual movers that are in its true coverage at any simulation time. In other words, the distribution list system acts as a filter providing all of the necessary equations of motion for movers 14 that are inside its sensing coverage along with others that might be nearby.

EOMANs 18 manage the equations of motion used by the sensors 12 local to its node. The purpose of EOMAN objects 18 is to maintain, at most, a single copy of a moving object's script on a given node. EOMAN objects 18 have the responsibility of locally distributing mover equations of motion, from their script, to appropriate sensors. There are multiple EOMANs 18 on each node so that a single EOMAN 18 does not become a bottleneck. Movers 14 choose their appropriate EOMAN 18 by using the simple modular arithmetic hashing scheme that takes the remainder after dividing the mover's identification by the number of EOMAN objects 18 created on each node.

Figure 5:
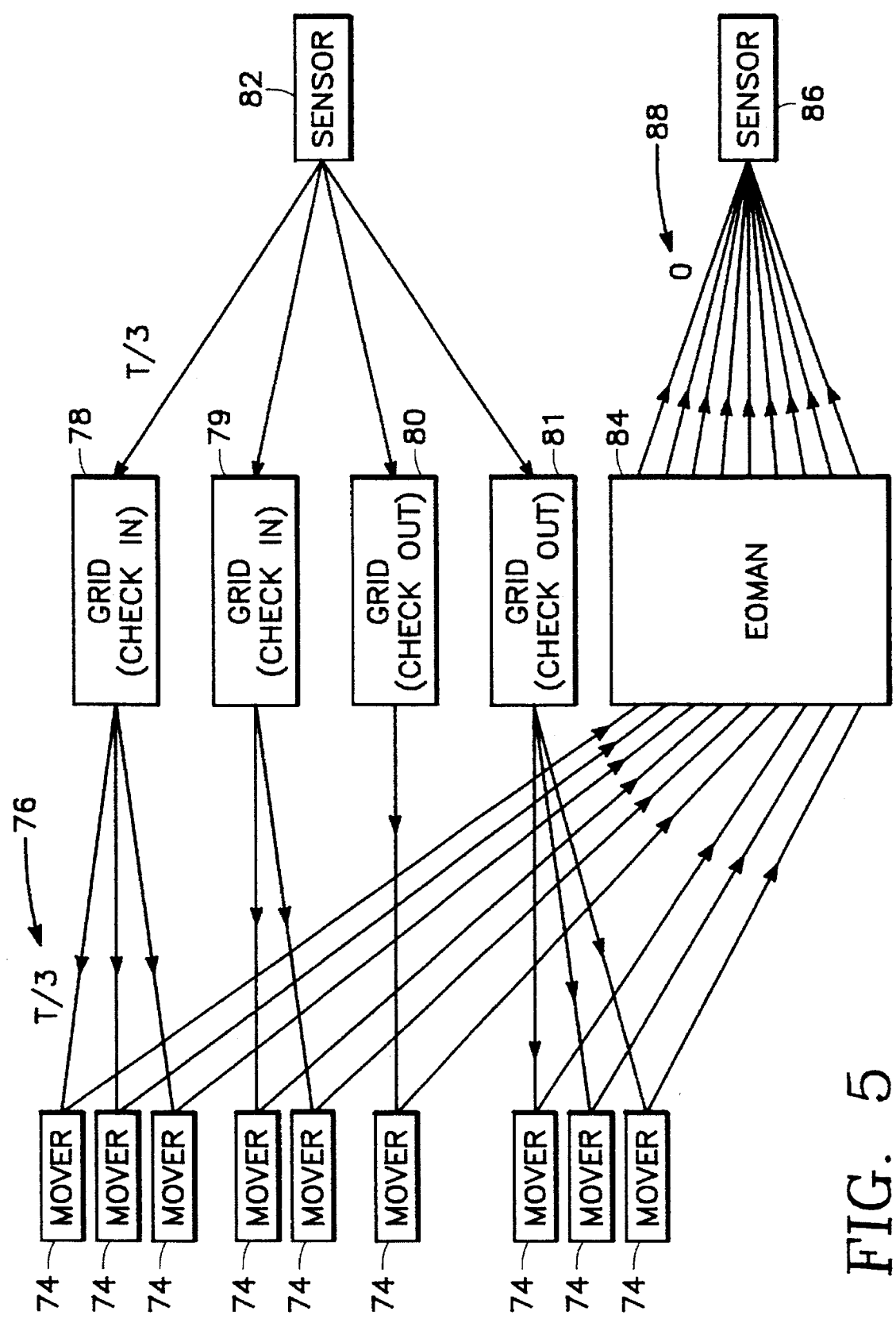
FIG. 5 illustrates a sample sequence of events for a sensor updating its grid coverage.

The present invention also provides a lookahead function. The lookahead function is the time difference, or delay, between a processed event and those that it generated. The lookahead function is important in both optimistic and conservative parallel simulations. For instance, optimistic parallel simulations with a high degree of lookahead tend to have fewer rollbacks, while conservative simulations often rely on lookahead to ensure causality or to prevent deadlocks. The lookahead function in the distribution list system is characterized by the parameter T as shown in FIGS. 4 and 5.

The lookahead function is incorporated in the distribution list system to add fixed delays as events are scheduled for objects on other nodes. Zero-time delays (i.e., scheduling events with no lookahead) are allowed for events scheduled between objects on the same node. In other words, events or events between an EOMAN object 18 and its local sensors 12 are self scheduled. Because lookahead delays events, it is preferably ensured that all sensors 12 have their required mover 14 equations of motion.

A lookahead delay 66 of T/3 is allowed for the internode communications. The lookahead value 66 T/3 is used for messages that are exchanged between objects that are on different nodes. However, EOMAN objects 18 are on the same node as their local sensor objects 12 so zero lookahead 67 is required. In this example, there are six sensors 12 on three different nodes 68, 69, and 70 that receive the mover's 14 current equation of motion.

Specifically, FIG. 4 depicts a sequence of message-events that are generated as a mover 14 checks in 62 and out 64 of its grids. At time, t, the mover 14 determines that it is in a new grid 62. Then at time, t+T/3, both the new 62 and the old 64, receive updates concerning the mover 14. The new grid 62 relays its corresponding sensor information back to the mover 14 with another delay of T/3 so that the mover 14 has the new sensor 12 information at time t+2T/3.

The mover 14 next relays its script to EOMAN objects 18, again with a delay of T/3, at time t+T. EOMAN objects 18 finally distribute the mover's 14 current equation of motion to their appropriate local sensors 12 with a zero time delay. Consequently, sensors 12 receive their updates T units of simulation time after the mover 14 determines that it is in a new grid 62. Similarly, as shown in FIG. 5, sensors 82 modify the grids in their coverage. The sensors 82 receive updates from movers 74 T units of simulation time after their coverage has changed.

FIG. 5 illustrates a sample sequence of events for a sensor 82 updating its grid coverage. In this example, the sensor 82 determines that there are two new grids 78 and 79 in its coverage and two old grids 80 and 81 that are no longer in its coverage. These grids relay the sensor information to their movers 74 which then update their corresponding EOMAN objects 84 back on the sensor's 86 node. A lookahead delay 76 of T/3 is allowed for the internode communications, but because the EOMAN objects 84 are on the same node as the sensor 86, zero lookahead 88 is required in the final step.

Both scenarios in FIGS. 4 and 5 result in proximity detection errors if further steps are not taken. For example, a mover 14 might have just entered a sensor's 12 coverage at time t, but because of the delay T, the sensor 12 would not know about the mover until time t+T. Thus, the sensor 12 would miss the mover 14 between times t and t+T, thereby having invalid proximity detection information.

The problem of sensors 12 receiving late mover 14 information is solved by extending each sensor's 12 coverage an additional distance amount of D. This amount D, must account for the fastest mover 14 in the simulation. Therefore, each sensor 12 must extend its coverage by the amount:

$$D = T \cdot V_{max} \text{(for all movers)}$$

By extending sensor 12 coverages by D, a buffer zone is provided to guarantee that even with the delay T, no mover 14 will be missed in a sensor's 12 true coverage. The amount of lookahead can be varied by changing the value T. No lookahead would then correspond to the value T being set to zero resulting in a zero value for D.

Figures 6, 7:
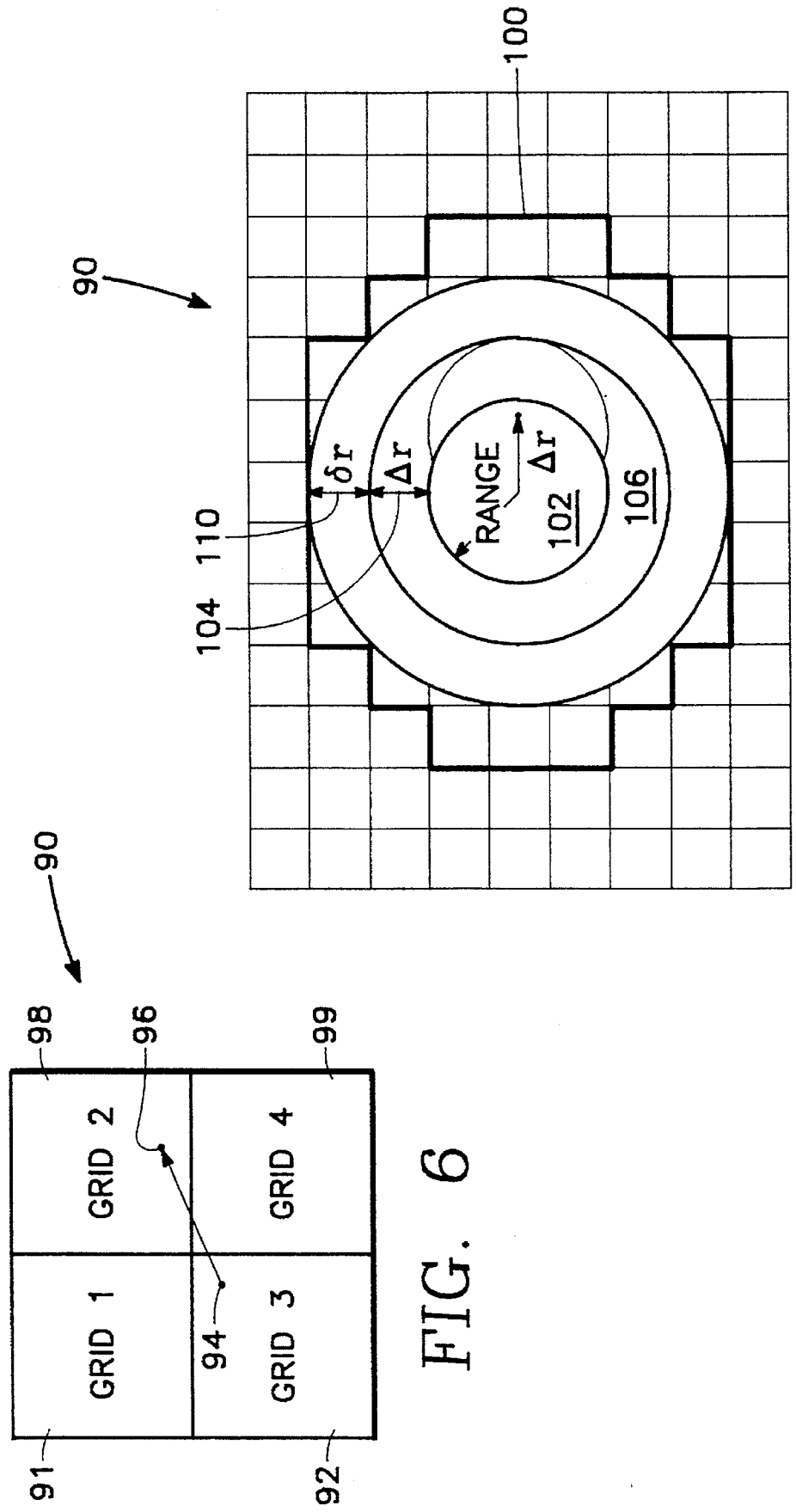
FIG. 6 illustrates an exploded view of a portion of the grid in accordance with the present invention.
FIG. 7 illustrates the interaction between fuzzy grids and sensors.

FIG. 6 illustrates an exploded view of a portion of the grid in accordance with the present invention. The distribution list system preferably uses an appropriate grid size. If grids are too small, then sensor coverages will contain large numbers of grids. This results in more sensor-grid messages than are necessary. Also, a large number of grids in sensor coverages can make their new/old grid computations become costly. Alternatively, if grids are too large, then sensors will have many movers in their list. Consequently, more computations per scan is required to filter out the extraneous movers. Therefore, it is important to choose a grid size that keeps the number of grids per sensor relatively small, without the grids being too small. A compromise must be made when the simulation involves differing sensor coverage sizes.

Even though the optimal grid size is a function of the number of nodes, synchronization strategy, and computer hardware, the distribution list system scales more than adequately. Alternatively, if most of the work in the simulation is done in sensor scan events, then proximity detection (i.e., sensors obtaining the equations of motion for nearby movers) is essentially provided for free, which is the goal. Typically most of the work in the simulation is done in sensor scan events since there are no intensive computations required by the distribution list system. Therefore, it should not be critical to completely optimize The Distribution List algorithm in practice.

Grids 90 play a fundamental role in the distribution list system. Movers and sensors both periodically check in and out of grids 91, 92, 98 and 99. Because grids may be irregular in shape, which is the case for a simulation where grids cover the earth, and because movers potentially move in complicated motion, computing exactly when a mover exits one grid and enters another can only be done iteratively, which is a very expensive endeavor. Also, computing exact grid crossings for movers can cripple the performance of any proximity detection algorithm.

Further, there may be problems, in terms of performance, for movers that just barely enter a grid and then almost immediately exit the same grid. For this scenario, lookahead, or the relative time difference between events and those that they schedule, may not be provided. Therefore, the proximity detection system does not compute grid crossings exactly. Instead, fuzzy grids are defined. Fuzzy grids do not require exact grid crossing calculations. Instead, fuzzy resolution parameters are defined that reflect various grid uncertainties.

FIG. 7 illustrates the interaction between fuzzy grids and sensors on a grid 90. Movers check in and out of grids but not at exact boundaries. Instead, a resolution parameter, δr (denoted by reference numeral 110 in the drawing), is defined. Movers 106 periodically calculate their grid as they move, at most, a distance of δr 110. Because movers 106 might change their velocity unexpectedly, the time period for movers to check their grid is given by:

$$\delta t = \frac{\delta r}{V_{max}(\text{mover})}$$

Each mover may have a different maximum velocity so that in general, δt can be different for each mover.

For instance, a mover 106 can calculate its grid at time t, and then almost immediately afterwards, enter the region of a different grid. Because the fuzzy grid mechanism does not recheck the mover's grid until time t+δt the mover 106 would actually be in the wrong grid for almost δt simulation time units. However, because of the way δt is defined, the mover is in error by at most δr 110, in terms of distance out of the grid. All sensor coverages must be expanded by the amount, δr 110, so that sensors can be guaranteed of having the equations of motion for all movers that are within their true sensing range. Also, expanding sensor coverages by δr 110 may increase the number of movers in a sensor's list of mover equations of motion. However, this is a welcome tradeoff for the added benefits of generality provided by fuzzy grids.

Referring back to FIG. 6 a mover at time t 94 in grid 3 92 moves in time 1+δt 96 where it then exits grid 3 92 and checks into grid 2 98. Exact grid crossings are not required. There is no need for the mover to check into grid 4 99. Fuzzy grids allow moving objects to be outside of their grid by the amount δr 110.

Moving sensors 102, like movers 106, do not add and delete grids from their coverages exactly in time as they move. Instead, a sensor resolution parameter, Δr 104 is defined. Each moving sensor 102 artificially expands its own coverage further by the amount Δr 104 to account for its own grid coverage uncertainty. Moving sensors 102 then only need to recompute their grid coverages at time intervals given by:

$$\Delta t = \frac{\Delta r}{V_{max}(\text{sensor})}$$

Each moving sensor may have a different maximum velocity so that Δt can be different for each sensor and fixed sensors have Δr=0, and Δt=∞.

Extending a sensor's 102 coverage by Δr 104 may at first seem like more than what is necessary. However, the fuzzy grid approach assumes that sensors may change their motion at any time, possibly moving in the opposite direction at maximum velocity. Therefore, sensor coverages are expanded symmetrically in all directions to accommodate possible changes to their motion.

As a result, the true coverage of a sensor 102 is always contained within its expanded coverage. FIG. 7 shows how a moving sensor 102 expands its coverage to accommodate the two fuzzy resolution parameters, δr 110 for movers and Δr 104 for sensors 102. Thus, a moving sensor's 102 coverage is expanded by δr 110 to account for fuzzy movers 106 and then by Δr 104 to keep the sensor's 102 true coverage within the current set of grids 90. The solid outline 100 of FIG. 7 illustrates which grids are contained in the sensor's coverage.

Figure 8:
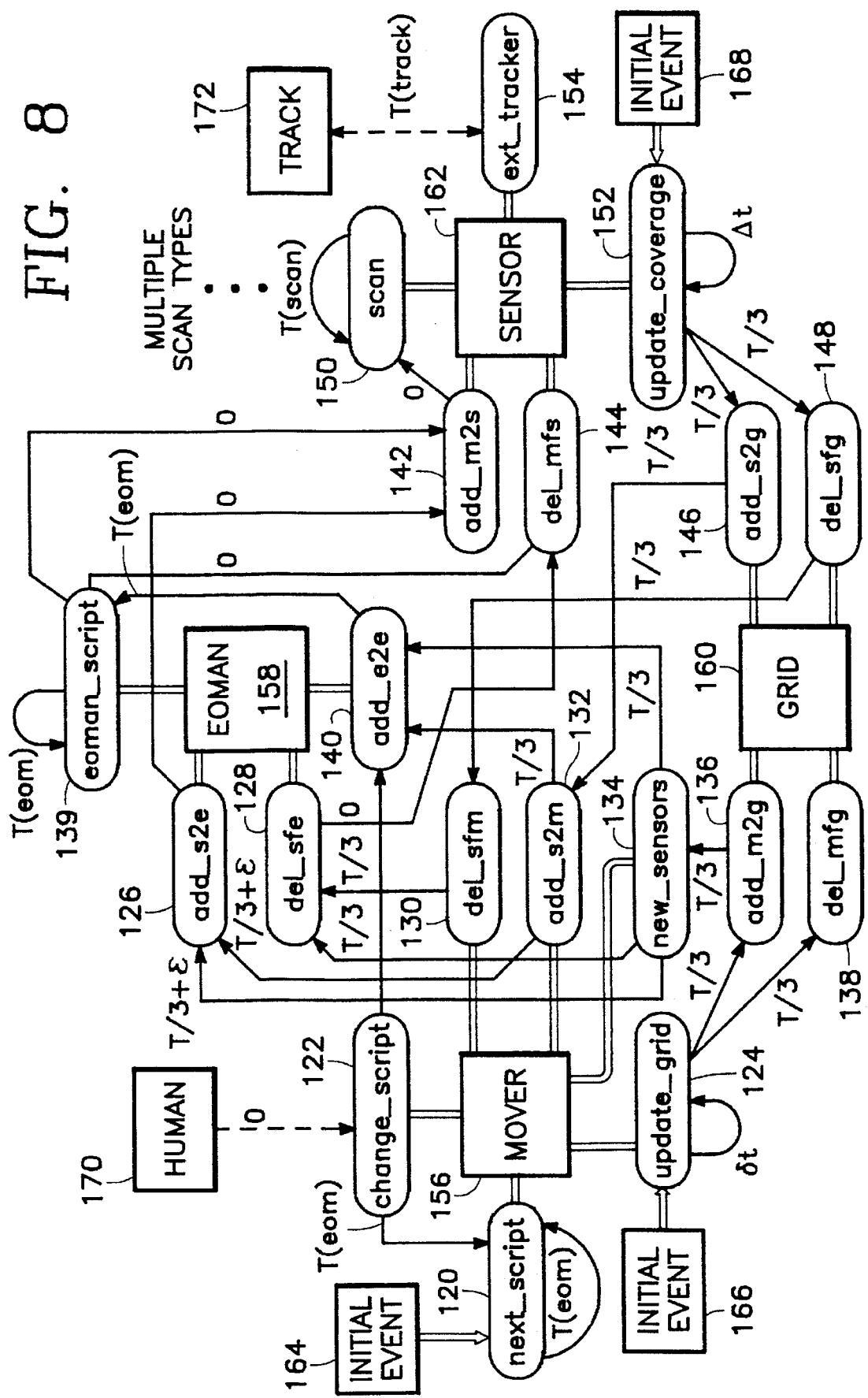
FIG. 8 illustrates an overall flow diagram of the distribution list system in the SPEEDES operating system for parallel proximity detection.

FIG. 8 illustrates an overall flow diagram of the distribution list system in the SPEEDES operating system for parallel proximity detection. The SPEEDES operating system is a synchronous parallel environment emulation and discrete event simulation operating system, as disclosed in the above-referenced patent application. SPEEDES relates to discrete event simulation of objects using a plurality of synchronous parallel computers in communication with each other so that the objects being simulated may interact in a logically correct manner. FIG. 8 illustrates how events are generated, which objects they act on, and the amount of lookahead provided as events are scheduled.

One feature of the present invention as implemented in the SPEEDES operating environment is that events are separated from the simulation objects that they "act" on. This reflects the highly object-oriented nature of event processing in SPEEDES. Specifically, events are encapsulated C++ objects and are separate from the simulation objects that they "act" on. Events as objects have excellent benefits in terms of scalable software engineering practices and they also provide very powerful mechanisms for supporting external input/output (I/O), efficient incremental state saving, and lazy cancellation techniques.

THE DISTRIBUTION LIST

The following is an explanation of the structure of the distribution list operating in, for example, the SPEEDES operating environment.

Interconnections between distribution list items

Event objects include a next_script 120, change_script 122, update_grid 124, add_s2e 126, del_sfe 128, del_sfm 130, add_s2m 132, new_sensors 134, add_m2g 136, del_mfg 139, eoman_script 138, add_e2e 140, add_m2s 142, del_mfs 144, add_s2g 146, del_sfg 148, scan 150, update_coverage 152, and ext_tracker 154. A MOVER 156, EOMAN 158, GRID 160, and SENSOR 162 are coupled to respective event objects and represent different characteristics of simulation objects. For example, a MOVER 156 can also be a SENSOR 162. Initial events 164, 166, 168, are scheduled at the start of the simulation at the next_script 120, update_grid 124, and update_coverage 152, respectively. HUMAN 170 and TRACK 172 external modules are located outside of the internal simulation.

The TRACK 172 sends messages to the ext_tracker 154 and also receives messages sent from the ext_tracker 154. Also, the HUMAN 170 sends messages to the change_script 122. The MOVER 156 is linked to the next_script 120, change_script 122, del_sfm 130, add_s2m 132, new_sensors 134, and update_grid 124. The EOMAN 158 is linked to the eoman_script 139, add_e2e 140, del_sfe 128, and add_s2e 126. The SENSOR 162 is linked to the scan 150, ext_tracker 154, update_coverage 152, del_mfs 144, and add_m2s 142. The GRID 160 is linked to the add_m2g 136, add_s2g 146, del_sfg 148, and del_mfg 138.

The next_script 120 schedules itself by a lookahead amount of T(eom), where the T(eom) is the start time of the next equation of motion in the MOVER's 156 script, while the change_script 122 schedules the next_script 120 by a lookahead amount of also T(eom). The change_script 122 also schedules the add_e2e 140 by a lookahead amount of T(eom). The update_grid 124 schedules itself, the add_m2g 136, and del_mfg 138 by a lookahead amount of δt, T/3, and T/3, respectively, where T is a user selectable runtime parameter. Both the add_s2e 126 and the del_sfe 128 schedule the add_m2s 142 and the del_mfs 144, by a lookahead amount of 0, respectively. The del_sfm 130 schedules the del_sfe 128 by a lookahead amount of T/3. The add_s2m 132 schedules the add_s2e 126 and the add_e2e 140 by a lookahead amount of T/3+ε and T/3, respectively. The new_sensors 134 schedules the add_s2e 126 and the del_sfe 128 by a lookahead amount of T/3+ε and T/3, respectively. The new sensors 134 also schedules the add_e2e 140 by a lookahead amount of T/3. The add_m2g 136 schedules new_sensors 134 by a lookahead amount of T/3. The eoman_script 139 schedules itself by a lookahead amount of T(eom). The eoman_script 138 also schedules the del_mfs 144 and the add_m2s 142 by a lookahead amount of 0. The add_e2e 140 schedules eoman_script 139 by a lookahead amount of T(eom). The add_m2s 142 schedules the scan 150 by a lookahead amount of 0. The add_s2g 146 schedules the add_s2m 132 by a lookahead amount of T/3. The del_sfg 148 schedules the del_sfm 130 by a lookahead amount of T/3. The scan 150 schedules itself by a lookahead amount of multiple scan types of T(scan). The update_coverage 152 schedules itself by a lookahead amount of Δt. The update_coverage 152 also schedules the add_s2g 146 and the del_sfg 148 by a lookahead amount of T/3, respectively.

The following is a functional explanation of the distribution list and the interaction between the event objects, simulation objects, links, scheduling, and lookahead amounts.

The Initial Events

The distribution list system includes initial events that start up the simulation. The next_script 120, update_grid 124, and update_coverage 152 are three kinds of initial events that are self-scheduling events. The next_script 120 event is scheduled for each mover in the simulation. The next_script 120 event manages its mover's script of equations of motion. An equation of motion has a start time and an end time. The end time of an equation of motion can be infinity. Scripts are constructed by consecutive equations of motion without time gaps. The next_script 120 event removes the current equation of motion from the mover's script at its end time so that the next item in the script will represent the movers correct equation of motion.

When next_script 120 event is processed, it first checks if the end time of the current equation of motion matches the event time tag. If it does, then the event is processed and reschedules itself for the next equation of motion in the mover's script, unless the script is empty, or if the new equation of motion has an end time of infinity. However, if the time tag does not match the end time of the mover's current equation of motion, the event knows that the mover has changed its script unexpectedly (see the change_script 122 event), and thus, the event does not process. This eliminates the need for user cancellation of next_script 120 events.

The update_grid 124 event is scheduled for each mover in the simulation. The update_grid 124 event computes the grid that the mover is in, and then if this is a new grid, it schedules events to move into the new grid, such as add_m2g 136, and to move out of the old grid, such as del_mfg 138, with lookahead T/3. When the update_grid 124 event is initially processed, its mover is not in a grid yet, so it only schedules one event, such as add_m2g 136, to check into the new grid. The update_grid 124 event then reschedules itself, unless its script is empty, to occur at δt time units into the future (see discussion on fuzzy grids).

The update_coverage 152 event is scheduled for each sensor in the simulation. The update_coverage 152 event computes grid coverages for a sensor with coverages that are expanded by three parameters, such as, δr, Δr and D. The update_coverage 152 event checks which grids are new and which grids are old. The changes are then sent with lookahead T/3 to the grids by scheduling two events, such as, add_s2g 146 and del_sfg 148. The update_coverage event 152 then reschedules itself Δt time units later. It is noted the Δt is infinite for non-moving sensors.

Grid Events

The add_m2g 136, del_mfg 138, add_s2g 146, and del_sfg 148 are four kinds of events that act on grids. These events involve adding movers and sensors to grids, or deleting them from grids.

First, when a mover checks into a new grid with the event add_m2g 136, it simultaneously checks out of its old grid with the event del_mfg 138, unless it is the first time when an old grid does not exist. The new grid relays its sensor information back to the mover so that the mover can correctly distribute its equations of motion to the appropriate sensors.

Second, as sensors check their coverages, they determine which old grids are no longer in their coverage and which new grids are now currently in their coverage. Add_s2g 146 events are then scheduled to add the sensor into its new grids, and del_sfg 148 events are scheduled to delete the sensor from its old grids. The new sensor information is then relayed to the movers in the sensor's new and old grids.

Updating the Mover's Distribution List

Three events, the new_sensors 134, add_s2m 132, and del_sfm 130, can modify a mover's distribution list. The new_sensors 134 event contains a new distribution list for the mover. This new distribution list is compared with the mover's old distribution list. Sensor's that are in the new list, but not in the old list, must receive a copy of the mover's equations of motion. Similarly, sensors that are in the old list, but not in the new list, must have the mover's equations of motion removed. The add_s2m 132 and del_sfm 130 events also update distribution lists in a similar way as sensors change their grid coverage.

Adding Equations of Motion to Sensors

The new_sensors 134 and add_s2m 132 events may add new sensors to a mover's distribution list. Because the distribution list ensures that, at most, only one copy of a mover's equations of motion resides on a node, a check is made to see if the mover's script has already been sent to the appropriate EOMAN object 158. It should be noted that hashing is used based on the mover's unique identification to determine which EOMAN object 158 to use on the sensor's node. If the mover's script does not reside on the sensor's node, an add_e2e 140 event is scheduled for the appropriate EOMAN object 158 to add the mover's equations of motion, i.e., its script, to the EOMAN object 158. A lookahead value of T/3 is used. In addition, an add_s2e 126 event, or add sensor to EOMAN 158, is scheduled to occur by a lookahead amount of T/3+ε so that the mover's equations of motion are already residing in the EOMAN object 158 when the mover's current equation of motion is passed to the sensor. When the EOMAN object 158 processes the add_e2e event 140, it sends a pointer to the mover's current equation of motion to the sensor through the add_m2s 142 event, and not a full copy of it.

A special self-scheduling event, the eoman_script 139, is generated when the add_e2e 142 event is processed. The eoman_script 139 manages the mover's script in the EOMAN object 158, which is very similar to the to the next_script 120 event for the mover. However, there is one important difference. As the eoman_script 139 event removes the mover's old equation of motion from its script, at the end time of the equation of motion, it schedules an add_m2s 142 event for all sensors on its node that need the mover's next equation of motion. When processed, the add_m2s 142 event replaces the pointer to the mover's old equation of motion with a pointer to the mover's new equation of motion. No lookahead amount is required because these sensors are, by definition, on the same node as the EOMAN object 158. When the script is over, the mover's equation of motion pointer is then removed from the sensor.

Removing Equations of Motion from Sensors

The new_sensors 134 and the del_sfm 130 events may delete old sensors from a movers distribution list. If this occurs, the del_sfe 128 event is scheduled for the EOMAN object 158 on the sensor's node that deletes the sensor from the EOMAN 158. object. A lookahead value of T/3 is used. When the del_sfe 128 event is processed, it schedules an additional event, the del_mfs 144, for the sensor, with no lookahead, that removes the pointer to the mover's current equation of motion from the sensor's list.

When processing the del_sfm 130 event, if it is determined that there are no more sensors on that node that require the mover's equation of motion, the mover is informed that its script no longer exists on that node. Similarly, when the del_sfe 128 event is processed, it will remove the mover's script from the EOMAN object 158 because it too will know that no other sensors require its mover's equation of motion. It is noted that there is a delay of T/3 from the time the mover thinks that its script is no longer residing in the EOMAN 158 to the time that the EOMAN 158 actually removes the mover's script. It is important that things are kept straight, especially when human interactions or other mechanisms change the script of the mover unexpectedly.

Sensor Scans

Sensors 162 are idle if there are no movers in their perception envelope. Therefore, it is important to have a general mechanism to start up a sensor 162 when a mover enters its coverage, i.e., when the sensor 162 receives a mover's equation of motion.

This is accomplished by having each sensor 162 define its own scan 150 event type. For example, ground-based radars scan differently than airborne radars or space-based infrared sensors. This scan event is activated when a mover's equation of motion is added to a sensor's empty list. The scan event is a self-scheduling event, so it only needs to be activated when the sensor is idle. The scan event reschedules itself periodically if the sensor's mover list is not empty. If the sensor's mover list ever becomes empty, then the scan event terminates and will be activated again the next time a mover is added to the sensor's empty list.

The efficiency of sensor scans can be improved by computing the earliest time that a mover might enter the sensor's true coverage. However, that there may be extra movers in the sensor's list that are not in the sensor's true coverage. At time t, a sensor performs a sensor scan and determines that a mover is a distance d outside of the sensor's true coverage. Assuming that the mover and the sensor might fly directly towards each other, since a sensor and mover can both change their equations of motion unexpectedly, an earliest time value τ is computed by:

$$\tau = \frac{d}{|Vmax(\text{mover})| + |Vmax(\text{sensor})|}$$

The time value τ can be stored in the sensor's mover list for movers that are outside the sensor's true proximity so that a quick check on this value in subsequent scans can quickly filter this mover out of its scan computation. This is important if the work in computing if a mover is in a sensor's coverage is costly.

Also, external trackers, such as ext_tracker, can be plugged into any of the sensors in the simulation. These external tracker modules can then take over the tracking function of the sensor.

Human Interactions and Changing the Script

Although movers typically move according to predefined scripts of equations of motion, in a more complicated simulation, movers may change their motion based on either internal events. These external events can be, for example, a simulated military aircraft engaged in an interactive dogfight, or from human interactions coming from the outside world. In addition, the lookahead amount cannot be assumed. If a mover changes its equations of motion, then sensors in the mover's distribution list must receive those changes at that time.

A script is sent to an EOMAN object 158, the time tag of the change_script 122 or the add_s2m 132 event is also sent to control unexpected changes in mover scripts. These are the only events that send mover scripts to EOMAN objects 158. Therefore, the EOMAN 158 object always knows what time mover scripts are valid. If an EOMAN 158 ever gets a script from a mover with a later send time than a mover script that is currently in the EOMAN 158, it accepts it. Otherwise, the EOMAN object 158 knows that the current script is more up-to-date than the one that it is currently trying to add. Thus, the script is not added because it is not valid any longer. This approach alleviates the need for user event cancellation.

For instance, a simulation consisting of 800 ground radars, 947 commercial aircraft, and 173 military aircraft randomly flying about the earth can be used. The aircrafts can randomly change their motion, i.e., their scripts, using an exponential time distribution with a time constant of 10 minutes. The aircrafts can fly at velocities ranging from 125 to 1858 km per hour, or mach 2. Radar coverages can range from 150 to 1500 km. Sensor scan times can vary from one to fifteen seconds. Kalman filters can be used by all of the radars.

The grid size can be, for example, 500 km, which is a good match with typical sensor coverages. Both fuzzy grid parameters δr and Δr can be 100 km. The lookahead parameter, T, can be 100 seconds. This scenario of the distribution list provides locality for scan events and a high degree of parallelism in the simulation. Therefore, very high performance on large parallel machines can be achieved.

The present invention operates extremely well with the functions of the SPEEDES system, including Breathing Time Buckets, Lazy Cancellation and Time Warp. For example, lookahead allows risk-free synchronization strategies, such as Breathing Time Buckets. As a result, grid events tend never to roll back with Breathing Time Buckets.

Lazy Cancellation allows the events to be processed out of order when each event does not effect another event. Lazy Cancellation with tolerances is used in the present invention so that the user checks on his own and decides whether the event is to be reprocessed or rolled forward. Thus, mover events and sensor events can be processed out of order and mover events and sensor events are independent of each other. Lazy cancellation can also be used with Time Warp to reduce rollbacks for grid events as well. Consequently, Lazy cancellation for grid events, which can become a source of a fan-in and/or fan-out type of events, helps Time Warp become more stable.

The present invention can also be used on a variety of computer architectures and achieves outstanding performance on UNIX workstations over Ethernet for military simulations involving air and strategic defense scenarios. The present invention can also be used with other computer architectures.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. In a system of interconnected processor nodes operating on a parallel processing system, a method of performing proximity detection of sensors and movers in grids that model simulated space by processing events comprising discrete simulation objects defined by said sensors, said movers, and said grids distributed among said nodes as a sequence of discrete sensor, mover, and grid events with said movers continuously entering new grids and simultaneously exiting old grids and moving sensors periodically informing said grids of coverages of said sensors, comprising the steps of:

generating a distribution list of continually changing identifications of sensors and providing said list to said movers;

updating said distribution list of said changing identifications and providing said list to said movers as a script;

determining which nodes need said script of said movers and which nodes no longer need said script of said movers;

generating a mover's current equation of motion and providing said equation of motion to said sensor;

sending first said mover's script to said sensor's node if said mover's script is not on said sensor's node and then providing a pointer to said mover's current equation of motion to said sensor;

removing automatically said mover's script if there are no more sensors on said node that need said mover's current equation of motion;

passing pointers to new equations of motion to appropriate sensors when a mover's equation of motion reaches its end time and a next equation of motion begins;

removing equation of motion pointers from corresponding sensors when said mover's script ends so that there are no more equations of motion in a mover's script; and determining the exact positions of all movers by said sensors that are in said sensors coverage area from said mover's equations of motion to create a logically correct solution without approximations.

2. The invention as set forth in claim 1 further comprising the step of changing motion of said movers.

3. The invention as set forth in claim 2, wherein said changing motion of said movers is performed by human interactions.

4. The invention as set forth in claim 2, wherein said changing motion of said movers is performed by internally computed changes.

5. The invention as set forth in claim 1, further comprising the step of providing fuzzy grids for crossings of said movers across irregular grids.

6. The invention as set forth in claim 5, further comprising the steps of:

modeling simulated space and managing spatial information for said movers and said sensor coverages;

computing approximate grid crossings of said movers and sensor coverages; and expanding sensor coverages by fuzzy resolution parameters so that said crossing of said irregular grids are accommodated.

7. The invention as set forth in claim 6, further comprising the step of defining fuzzy resolution parameters to reflect various grid uncertainties.

8. The invention as set forth in claim 1, further comprising the step of providing zero time delays for events scheduled between objects on the same node.

9. The invention as set forth in claim 1, further comprising the step of providing correct spatial information for objects that are moving.

10. The invention as set forth in claim 1, further comprising the steps of generating new events, and providing a lookahead function as a time difference between said processed events and said newly generated events for providing scalability and improving parallel performance.

11. The invention as set forth in claim 10, further comprising the step of adding fixed delays by said lookahead function as said events are scheduled for objects on other nodes.

12. The invention as set forth in claim 10, wherein Breathing Time Buckets never roll back grid events.

13. The invention as set forth in claim 8, further providing the step of Lazy Cancellation for allowing events to be processed out of order when each event does not affect another event.

14. The invention as set forth in claim 13, wherein said Lazy Cancellation step utilizes tolerances so that a user checks and decides whether said event is to be reprocessed or rolled forward.

15. The invention as set forth in claim 14, wherein said Lazy Cancellation step processes mover events and sensor events out of order so that mover events and sensor events are independent of each other.

16. The invention as set forth in claim 14, wherein said Lazy Cancellation in combination with a Time Warp reduces roll back of grid events.

17. In a system of interconnected processor nodes operating in parallel on a processing system to simulate mutual interactions of a set of discrete simulation objects defined by movers, sensors, and grids, wherein said simulation objects are distributed among said nodes as a sequence of discrete sensor, mover, and grid events changing state variables of respective simulation objects performing object-oriented simulation at each one of said nodes, a method of performing proximity detection of said movers and said sensors in said grids that model simulated space in said sequence of events by processing said discrete events, comprising the steps of:

entering a new grid and simultaneously exiting an old grid by said movers;

informing said grids of coverage areas of said sensors periodically;

generating a distribution list of sensors' identifications and providing said list to said movers;

updating said distribution list of said sensors' identifications and providing said list to said movers as a script;

determining which nodes need said script of said movers and which nodes no longer need said script of said movers;

managing said script of said movers by said movers;

generating a mover's current equation of motion and providing said equation of motion to said sensor through an EOMAN object on said sensor's node if said mover's script is on said sensor's node;

sending first said mover's script to an EOMAN object on said sensor's node if said mover's script is not on said sensor's node and then providing a pointer to said mover's current equation of motion to said sensor;

removing a mover's equation of motion pointer from said sensors through said EOMAN object;

removing automatically said mover's script from said EOMAN object if there are no more sensors on said node that need said mover's current equation of motion by said EOMAN object;

managing equation of motion in a mover's script by the EOMAN for the sensors;

passing pointers to new equations of motion to appropriate sensors when a mover's equation of motion reaches its end time and a next equation of motion begins;

removing equation of motion pointers from corresponding sensors when said mover's script ends so that there are no more equations of motion in a mover's script;

determining the exact positions of all movers by said sensors that are in said coverage areas of said sensors from said mover's equation of motion provided by said EOMAN object;

changing motion of said movers;

updating said mover's script in both said mover and in said EOMANs objects on different nodes.

18. The invention as set forth in claim 17, wherein said changing motion of said movers is performed by human interactions.

19. The invention as set forth in claim 17, wherein said changing motion of said movers is performed by internally computed changes.

20. The invention as set forth in claim 17, further comprising the step of providing fuzzy grids for crossings of said movers across irregular grids.

21. The invention as set forth in claim 20, further comprising the steps of:

modeling simulated space and managing spatial information for said movers and said coverage areas of said sensors;

computing approximate grid crossings of said movers and sensor coverages; and expanding sensor coverages by fuzzy resolution parameters so that said crossing of said irregular grids are accommodated.

22. The invention as set forth in claim 21, further comprising the step of defining fuzzy resolution parameters to reflect various grid uncertainties.

23. The invention as set forth in claim 17, further comprising the step of providing zero time delays for events scheduled between objects on the same node.

24. The invention as set forth in claim 17, further comprising the step of providing correct spatial information for objects that are moving.

25. The invention as set forth in claim 17, further comprising the steps of generating new events and providing a lookahead function as a time difference between said processed events and said newly generated events for providing scalability and improving parallel performance.

26. The invention as set forth in claim 25, further comprising the step of adding fixed delays by said lookahead function as said events are scheduled for objects on other nodes.

27. The invention as set forth in claim 25, wherein Breathing Time Buckets never roll back grid events.

28. The invention as set forth in claim 25, further providing the step of Lazy Cancellation for allowing events to be processed out of order when each event does not effect another event.

29. The invention as set forth in claim 28, wherein said Lazy Cancellation step utilizes tolerances so that a user checks and decides whether said event is to be reprocessed or rolled forward.

30. The invention as set forth in claim 29, wherein said Lazy Cancellation step processes mover events and sensor events out of order so that mover events and sensor events are independent of each other.

31. The invention as set forth in claim 29, wherein said Lazy Cancellation in combination with a Time Warp reduces roll back of grid events.

32. A system of interconnected processor nodes operating in parallel on a processing system to simulate mutual interactions of a set of discrete simulation objects defined by movers and sensors, wherein said simulation objects are distributed among said nodes as a sequence of discrete sensor, mover, and grid events changing state variables of respective simulation objects performing object-oriented simulation at each one of said nodes and performing proximity detection of said movers and said sensors in said sequence of events by processing said events, comprising:

a plurality of grids each representing discrete simulation objects that model simulated space and have grid spaces defining a tiled area, a list of movers that are located in said grid spaces, and a list of sensors for viewing said grid spaces, wherein said plurality of grids respectively manage said list of movers and said list of sensors that are operating in said grid spaces;

wherein each of said movers has an equation of motion with node-distribution information and a script including a sequence of said equations of motion;

wherein each of said sensors has a list of pointers to said equations of motion of said movers;

wherein said movers further comprise a distribution list containing said sensors;

a plurality of EOMAN objects located on said nodes having a list of mover scripts and a list of sensors for each of said mover scripts, wherein said EOMAN objects manage said equations of motion of said movers that are used by said sensors that are local to said nodes so that said equations of motion are locally distributed to appropriate sensors;

wherein said sensors move around a coverage area and periodically inform said grids of coverage areas of said sensors; and wherein said movers move according to a sequence of at least one of said equations of motion.

33. The invention as set forth in claim 32, further comprising fuzzy grids modeling simulated space for approximating crossing calculations of said movers across irregular grids.

34. The invention as set forth in claim 32, further comprising:

means for modeling simulated space and managing spatial information for said movers and said coverage areas of said sensors;

means for computing approximate grid crossings of said movers and said coverage areas of said sensors; and means for expanding sensor coverages by fuzzy resolution parameters so that said crossing of said irregular grids are accommodated.

35. The invention as set forth in claim 34, further comprising means for defining fuzzy resolution parameters to reflect various grid uncertainties.

36. A system of interconnected processor nodes operating on a parallel processing system having grids that model simulated space to simulate mutual interactions of a set of discrete simulation objects defined by movers, sensors, and said grids, wherein said simulation objects are distributed among said nodes as a sequence of discrete sensor, mover, and grid events for performing proximity detection of said movers and said sensors in said grids in said sequence of events by processing said events, said system comprising:

movers entering a new grid and simultaneously exiting an old grid and having an equation of motion with node-distribution information and a script including a sequence of said equations of motion;

sensors having a list of equations of motion of said movers, and wherein said sensors move around a coverage area;

wherein said movers further comprise a distribution list containing identifications of said sensors;

means for informing periodically said grids of said coverage areas of said sensors moving;

means for managing said distribution list that are operating in represented space of said grids;

means for creating a current list of said sensors;

means for returning said current list to said mover; and means for updating said distribution list by said sensors of said movers based on said current list to define a new coverage area, wherein a logically correct solution is created without approximations.

37. The invention as set forth in claim 36, wherein said parallel processing system is a synchronous parallel environment emulation and discrete event simulation operating system.

38. The invention as set forth in claim 36, further comprising a plurality of EOMAN objects located on said nodes having a list of mover scripts and a list of sensors for each of said mover scripts, wherein said EOMAN manages said mover equations of motion used by said sensors that are local to said nodes so that said equations of motion are locally distributed to appropriate sensors.

39. The invention as set forth in claim 36, further comprising fuzzy grids modeling simulated space for approximating crossing calculations of said movers across irregular grids.

40. The invention as set forth in claim 36, further comprising newly generated events and a lookahead function defined as a time difference between said processed events and said newly generated events for reducing grid events from rolling back.

41. The invention as set forth in claim 36, wherein said grids further comprise grid spaces defining a tiled area, a list of movers that are located in said grid spaces, and a list of sensors for viewing said grid spaces and wherein said grids respectively manage said list of movers and said list of sensors that are operating in said grid spaces.

* * * * *